(12) United States Patent
Sano

(10) Patent No.: US 6,876,059 B2
(45) Date of Patent: Apr. 5, 2005

(54) SEMICONDUCTOR INTEGRATED CIRCUIT DEVICE AND METHOD OF MANUFACTURING THE SAME

(75) Inventor: Fumihiko Sano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/618,020

(22) Filed: Jul. 14, 2003

(65) Prior Publication Data

US 2004/0212040 A1 Oct. 28, 2004

(30) Foreign Application Priority Data

Apr. 23, 2003 (JP) .......................................... 2003-118742

(51) Int. Cl.$^7$ .............................................. H01L 29/00
(52) U.S. Cl. ...................... 257/532; 257/296; 257/310; 257/533; 257/534; 257/535; 438/393; 438/394; 438/395; 438/396
(58) Field of Search ................................ 257/296, 310, 257/532–535; 438/393–396

(56) References Cited

U.S. PATENT DOCUMENTS

| | | | | | |
|---|---|---|---|---|---|
| 5,194,932 | A | * | 3/1993 | Kurisu | 257/773 |
| 5,614,743 | A | * | 3/1997 | Mochizuki | 257/276 |
| 6,147,857 | A | * | 11/2000 | Worley et al. | 361/301.2 |
| 6,285,050 | B1 | * | 9/2001 | Emma et al. | 257/296 |
| 6,646,860 | B2 | * | 11/2003 | Takaramoto et al. | 361/306.3 |

FOREIGN PATENT DOCUMENTS

| | | |
|---|---|---|
| JP | 8-274258 | 10/1996 |
| JP | 2001-102529 | 4/2001 |

* cited by examiner

Primary Examiner—David Nelms
Assistant Examiner—Andy Huynh
(74) Attorney, Agent, or Firm—Oblon, Spivak, McClelland, Maier & Neustadt, PC

(57) ABSTRACT

A semiconductor integrated circuit device according to an embodiment of the present invention has an MIM structure capacitor connected between a power source potential electrode wiring and a ground potential electrode wiring each via at least one interlayer connection wiring.

8 Claims, 4 Drawing Sheets

SEMICONDUCTOR INTEGRATED CIRCUIT DEVICE AND METHOD OF MANUFACTURING THE SAME

CROSS-REFERENCE TO RELATED APPLICATION

This application is based upon and claims the benefit of priority from the prior Japanese Patent Application No. 2003-118742, filed on Apr. 23, 2003; the entire contents of which are incorporated herein by reference.

BACKGROUND OF THE INVENTION

1. Field of the Invention

The present invention relates to a semiconductor integrated circuit device and a method of manufacturing the same and, more particularly, to a by-pass capacitor disposed between a power source potential node and a ground potential node and a method of manufacturing the same.

2. Related Background Art

In a semiconductor integrated circuit, as a countermeasure against EMI (Electro Magnetic Interference) of canceling off power source noise between a power source potential node and a ground potential node, entering from the external via the power source potential node and the ground potential node, a by-pass capacitor is disposed between the nodes.

The following five modes can be mentioned as conventional modes of disposing a by-pass capacitor between a power source potential node and a ground potential node of a semiconductor integrated circuit.

In a first conventional mode, by using a source potential and a drain potential of an n-channel MOS transistor as a ground potential and using a gate potential as a power source potential, or by using a source potential and a drain potential of a p-channel MOS transistor as a power source potential and using a gate potential as a ground potential, a by-pass capacitor including a gate insulation film made of a dielectric is formed.

In a second conventional mode, a power source potential pad and a ground potential electrode pad are disposed so as to be adjacent to each other and a metal wiring led from one of the electrode pads is laid under the other electrode pad via an interlayer insulation film, thereby forming a by-pass capacitor including an interlayer insulation film made of a dielectric.

In a third conventional mode, a power source potential lead frame and a ground potential lead frame are disposed so as to be adjacent to each other in an LSI package and only the portion between the lead frames is molded by a ferromagnetic, thereby forming a by-pass capacitor using the molding material as a dielectric.

In a fourth conventional mode, a by-pass capacitor is mounted and connected as a separate part near a power source terminal and a ground terminal of an LSI on a mounting board.

In a fifth conventional mode, when a dummy trench exists under an electrode pad in a DRAM embedded LSI or the like, a by-pass capacitor is formed by using the dummy trench. Refer to Japanese Patent Laid-Open Pub. No. 08-274258 (274258/1996) as an example of the fifth conventional mode.

One of various capacitors is an MIM (Metal-Insulator-Metal) structure capacitor. Structures to achieve smaller size and larger capacitance of the MIM structure capacitor have been proposed. As an example of such a structure, refer to Japanese Patent Laid-Open Pub. No. 2001-102529.

Each of the conventional modes has, however, the following problems.

In the first conventional mode, since an area for forming a by-pass capacitor is limited in an LSI in which the ratio of area of transistors used for an internal circuit is high, it is difficult to obtain large capacitance. Moreover, since the gate insulation film is used as a dielectric, the possibility of destruction of the gate insulation film is high.

In the second conventional mode, the interlayer insulation film used as a dielectric is thick, so that it is difficult to obtain a large capacitance. Since wirings of different potentials are laid under electrode pads, short-circuit tends to occur between the power source and the ground by a probe pressure applied at the time of wafer measurement.

In the third conventional mode, a different material is used only for a part of the molding, so that the molding process is complicated and the number of steps also increases.

In the fourth conventional mode, the number of mounting parts increases, so that it causes increase in the failure rate at a mounting level and increase in the mounting area and volume.

In the fifth conventional mode, in the case of a circuit device other than a DRAM embedded LSI, the number of steps for forming a trench capacitor increases and it causes increase in manufacturing time and cost.

SUMMARY OF THE INVENTION

According to a first aspect of a semiconductor integrated circuit device as an embodiment of the invention, there is provided with a semiconductor integrated circuit device comprising an MIM structure capacitor connected between a power source potential electrode wiring and a ground potential electrode wiring each via at least one interlayer connection wiring.

According to a second aspect of a semiconductor integrated circuit device as an embodiment of the invention, there is provided with a semiconductor integrated circuit device comprising: a metal electrode on one side connected to a power source potential electrode wiring via at least one interlayer connection wiring; a metal electrode on the other side connected to a ground potential electrode wiring via at least one interlayer connection wiring; and an insulation dielectric sandwiched by the metal electrode on one side and the metal electrode on the other side.

According to a first aspect of a method of manufacturing a semiconductor integrated circuit device, there is provided with a method of manufacturing a semiconductor integrated circuit device comprising: forming an MIM structure capacitor; covering the MIM structure capacitor with an interlayer insulation film; opening contact holes in the interlayer insulation film on a metal electrode on one side and a metal electrode on the other side of the MIM structure capacitor; forming an interlayer connection wiring in the contact holes; and forming a power source potential electrode wiring and a ground potential electrode wiring connected to the metal electrode on one side and the metal electrode on the other side, respectively, each via the interlayer connection wiring.

According to a second aspect of a method of manufacturing a semiconductor integrated circuit device as an embodiment of the invention, there is provided with a method of manufacturing a semiconductor integrated circuit device comprising: forming a metal electrode on one side; forming an insulation dielectric on a part of the metal-electrode on one side; forming a metal electrode on the other side on the insulation dielectric; covering the metal electrode on one side, the metal electrode on the other side, and the insulation dielectric with an interlayer insulation film; opening contact holes in the interlayer insulation film on the metal electrode on one side and the metal electrode on the other side; forming an interlayer connection wiring in the contact holes; and forming a power source potential electrode wiring and a ground potential electrode wiring connected to the metal electrode on one side and the metal electrode on the other side, respectively, each via the interlayer connection wiring.

DETAILED DESCRIPTION OF THE EMBODIMENTS

Embodiments of a semiconductor integrated circuit device according to the invention will be described hereinbelow with reference to the drawings.

In a semiconductor integrated circuit in which analog circuits such as an RF module, an A/D converter, a D/A converter, and an operational amplifier are mounted, an MIM structure capacitor is often used.

In the semiconductor integrated circuit devices according to the embodiments of the invention, an MIM structure capacitor is formed between wiring layers constructing a path for electrically connecting a power source potential electrode pad and a ground potential electrode pad or a power potential source ring and a ground potential power source ring, and is allowed to function as a by-pass capacitor between a power source potential node and a ground potential node.

Figure 1:
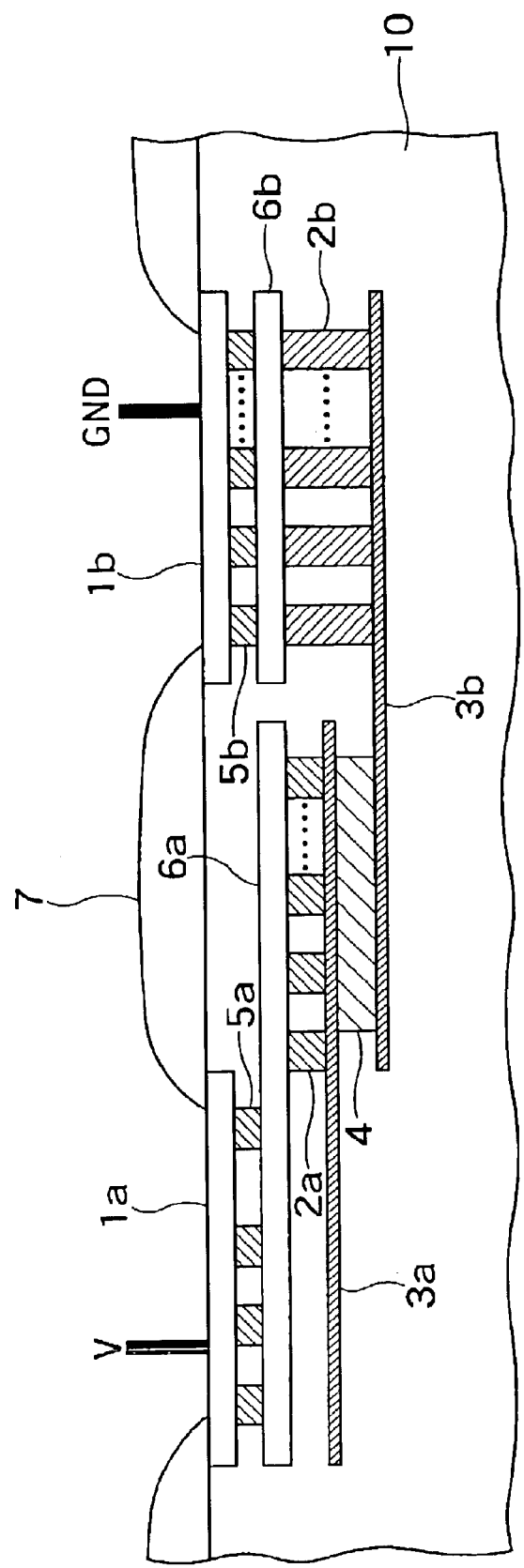
FIG. 1 is a cross sectional view showing the configuration of a semiconductor integrated circuit device according to a first embodiment of the invention.
Figure 2:
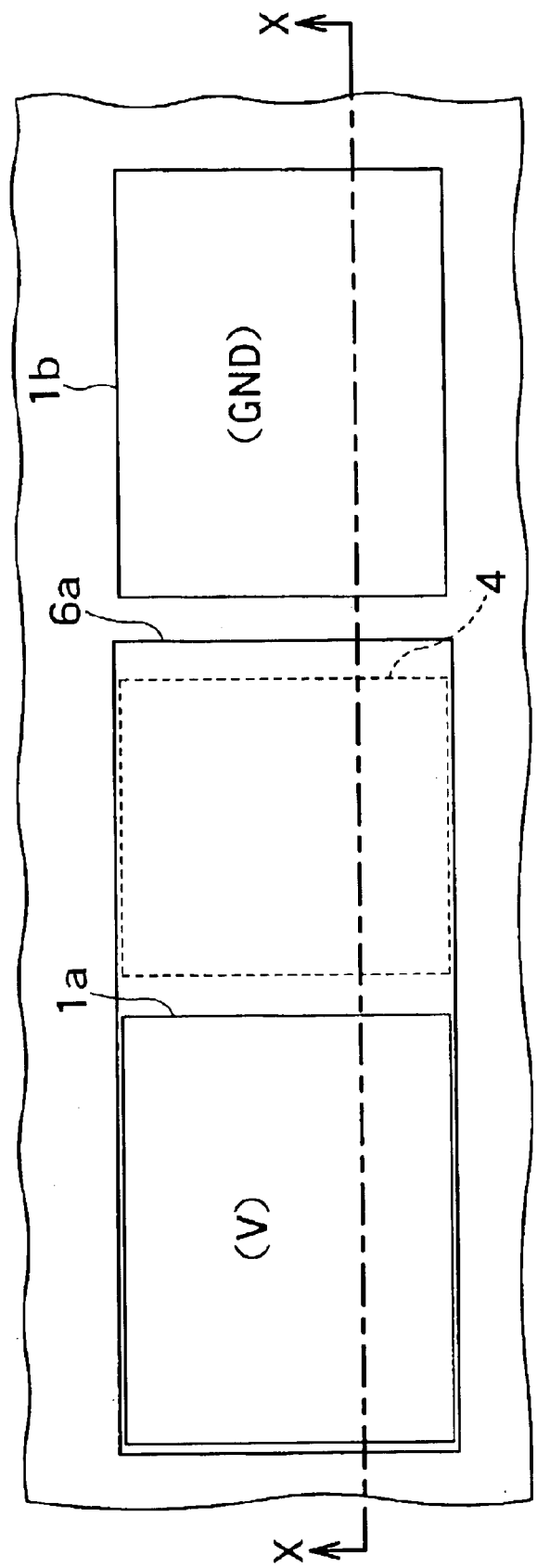
FIG. 2 is a plan view showing a schematic configuration of a semiconductor integrated circuit device according to the first embodiment of the invention.

FIG. 1 is a cross sectional view showing the configuration of a semiconductor integrated circuit device according to a first embodiment of the invention. FIG. 2 is a plan view showing a schematic configuration of the semiconductor integrated circuit device according to the first embodiment of the invention. FIG. 1 is a cross section taken along a line X—X in the plan view of FIG. 2. FIG. 2 shows only main elements for easier understanding.

A semiconductor integrated circuit device according to the first embodiment of the invention includes a metal electrode 3b on one side, an insulation dielectric 4 formed on the metal electrode 3b on one side, a metal electrode 3a on the other side formed on the insulation dielectric 4, a first interlayer connection wiring 2a formed on the metal electrode 3a on the other side, a first metal wiring layer 6a formed on the first interlayer connection wiring 2a, a second interlayer connection wiring 5a formed on the first metal wiring layer 6a, a power source potential electrode pad 1a formed on the second interlayer connection wiring 5a, a third interlayer connection wiring 2b formed on the metal electrode 3b on one side, a second metal wiring layer 6b formed on the third interlayer connection wiring 2b, a fourth interlayer connection wiring 5b formed on the second metal wiring layer 6b, and a ground potential electrode pad 1b formed on the fourth interlayer connection wiring 5b.

In gaps among the metal electrodes, interlayer connection wirings (via wirings), metal wiring layers, and electrode pads, an interlayer insulation film 10 is formed. On the interlayer insulation film 10 formed in the gap between the electrode pads, a protection film 7 is formed so as to cover the boundary portions between the electrode pads and the interlayer insulation film. The power source potential electrode pad 1a is an electrode pad to which a power source potential V is supplied and a wiring from the external is connected. The ground potential electrode pad 1b is an electrode pad which is grounded and to which a wiring from the external is connected.

By the metal electrode 3b on one side, the metal electrode 3a on the other side, and the insulation dielectric 4 sandwiched by the electrodes 3b and 3a, an MIM structure capacitor is constructed.

The configuration of the semiconductor integrated circuit device according to the first embodiment of the invention has, in short, the metal electrode 3b on one side connected to the ground potential electrode pad 1b via at least one interlayer connection wiring, the metal electrode 3a on the other side connected to the power source potential electrode pad 1a via at least one interlayer connection wiring, and the insulation dielectric 4 sandwiched by the metal electrode 3b on one side and the metal electrode 3a on the other side.

A method of manufacturing the semiconductor integrated circuit device according to the first embodiment of the invention will now be described. In the following, only the manufacturing method of the portion shown in FIG. 1 in the semiconductor integrated circuit device according to the first embodiment of the invention will be described.

The whole portion of the interlayer insulation film 10 shown in the figure is not formed at once but is formed by stacking layers step by step in correspondence with other stacked products.

First, by depositing a metal film on the interlayer insulation film 10 and patterning the metal film, the metal electrode 3b on one side is formed.

After forming the metal electrode 3b on one side, by depositing an insulation dielectric material on the metal electrode 3b and patterning the material, the insulation dielectric 4 is formed on a part of the metal electrode 3b on one side.

After forming the insulation dielectric 4, the interlayer insulation film 10 is deposited and the top face of the interlayer insulation film 10 is planarized so that the top face of the insulation dielectric 4 is exposed, thereby forming the interlayer insulation film 10 to the same level as the top face of the insulation dielectric 4.

After depositing and planarizing the interlayer insulation film 10, a metal film is deposited on the insulation dielectric 4 and the interlayer insulation film 10 and patterned, thereby forming the metal electrode 3a on the other side so as to cover at least the top face of the insulation dielectric 4.

After forming the metal electrode 3a on the other side, the interlayer insulation film 10 is deposited to a predetermined thickness, and the top face of the interlayer insulation film 10 is planarized.

After depositing and planarizing the interlayer insulation film 10, contact holes are opened in the interlayer insulation film 10 on the metal electrode 3b on one side and the metal electrode 3a on the other side, an interlayer connection wiring material is deposited so as to bury the contact holes and an unnecessary interlayer connection wiring material on the interlayer insulation film 10 is removed, thereby forming the first interlayer connection wiring 2a on the metal electrode 3a on the other side and the third interlayer connection wiring 2b on the metal electrode 3b on one side.

After forming the first interlayer connection wiring 2a and the third interlayer connection wiring 2b, by depositing a metal film on the first interlayer connection wiring 2a, third interlayer connection wiring 2b, and interlayer insulation film 10 and patterning the metal film, the first metal wiring layer 6a connected to the first interlayer connection wiring 2a and the second metal wiring layer 6b connected to the third interlayer connection wiring 2b are formed.

After forming the first and second metal wiring layers 6a and 6b, the interlayer insulation film 10 is deposited to a predetermined thickness, and the top face of the interlayer insulation film 10 is planarized.

After depositing and planarizing the interlayer insulation film 10, contact holes are opened in the interlayer insulation film 10 on the first and second metal wiring layers 6a and 6b, the interlayer connection wiring material is deposited so as to bury the contact holes, and the unnecessary interlayer connection wiring material on the interlayer insulation film 10 is removed, thereby forming the second interlayer connection wiring 5a on the first metal wiring layer 6a and the fourth interlayer connection wiring 5b on the second metal wiring layer 6b.

After forming the second interlayer connection wiring 5a and the fourth interlayer connection wiring 5b, by depositing a metal film on the second and fourth interlayer connection wirings 5a and 5b and the interlayer insulation film 10 and patterning the metal film, the power source potential electrode pad 1a connected to the second interlayer connection wiring 5a and the ground potential electrode pad 1b connected to the fourth interlayer connection wiring 5b are formed.

After forming the power source potential electrode pad 1a and the ground potential electrode pad 1b, the interlayer insulation film 10 is deposited and the top face of the interlayer insulation film 10 is planarized so that the top faces of the power source potential electrode pad 1a and the ground potential electrode pad 1b are exposed, thereby forming the interlayer insulation film 10 to the same level as the top faces of the power source potential electrode pad 1a and the ground potential electrode pad 1b.

By forming the protection film 7 on the interlayer insulation film 10 formed in the gap between the electrode pads so as to cover the boundary portions between the electrode pads and the interlayer insulation film 10, the manufacturing of the semiconductor integrated circuit device according to the first embodiment of the invention shown in FIGS. 1 and 2 is completed.

In the semiconductor integrated circuit device according to the first embodiment of the invention and the method of manufacturing the same, with the above described configuration, the MIM structure capacitor is connected as a by-pass capacitor between the power source potential electrode pad and the ground potential electrode pad which are adjacent to each other each via at least one interlayer connection wiring. Consequently, while effectively suppressing the possibility of destruction and increase in the number of manufacturing steps and cost, power source noise can be eliminated or suppressed by the by-pass capacitor having a sufficient capacitance. Therefore, power source noise entering from the external and power source noise occurring in the LSI can be blocked at the power source input/output nodes. Further, by removing the by-pass capacitor from the face of the mounting board, the mounting area and the volume can be reduced.

Figure 3:
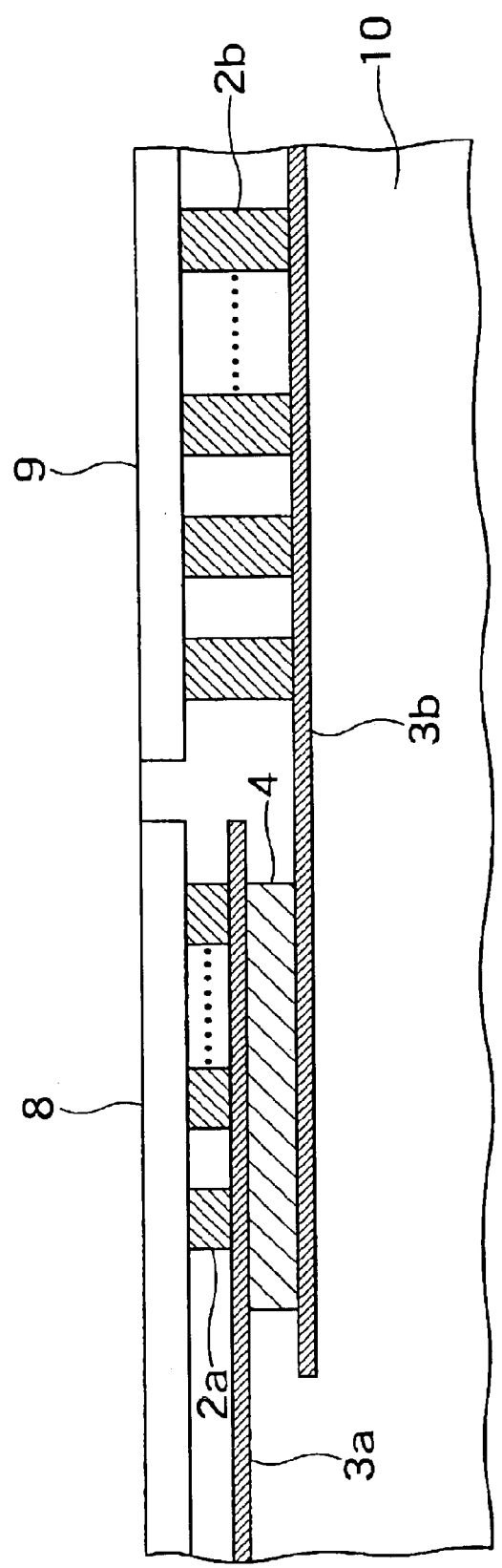
FIG. 3 is a cross sectional view showing the configuration of a semiconductor integrated circuit device according to a second embodiment of the invention.
Figure 4:
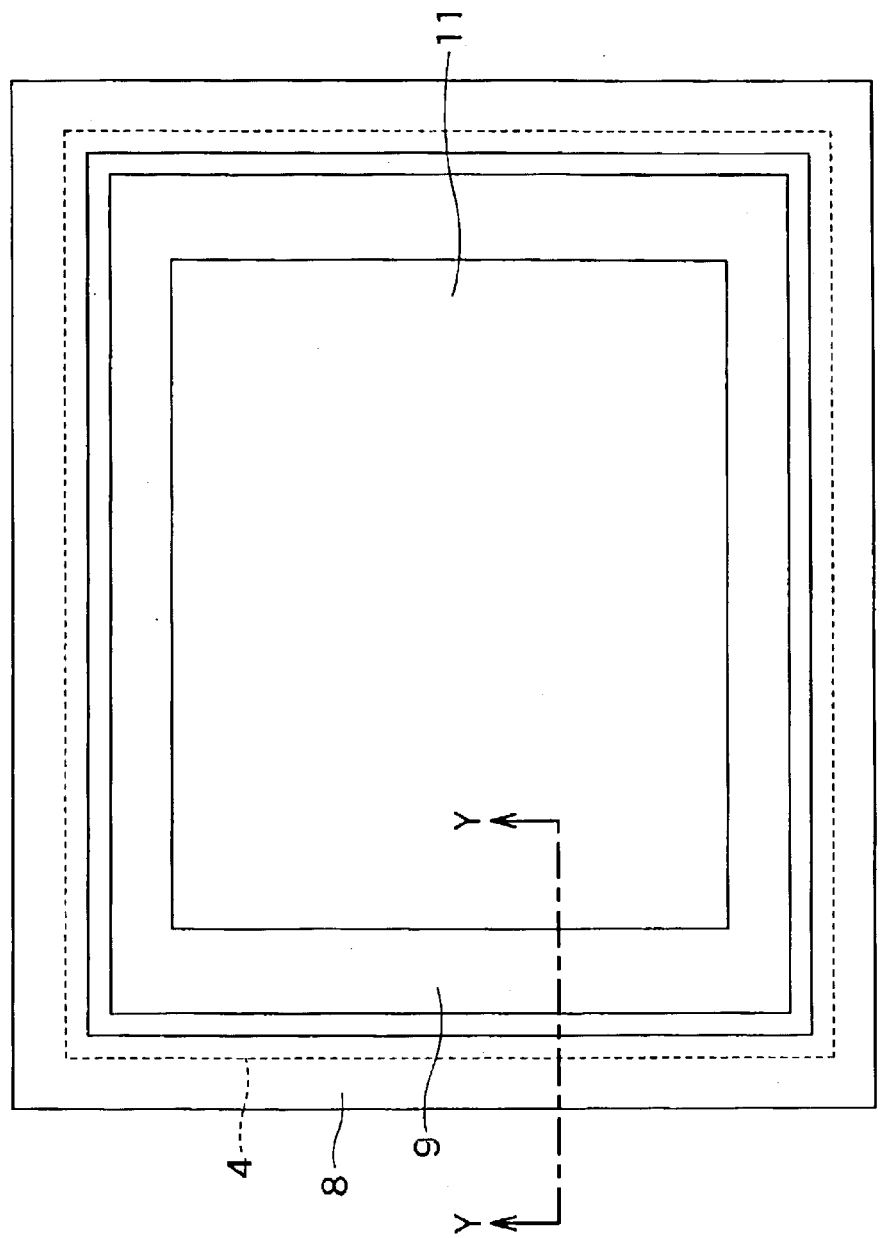
FIG. 4 is a plan view showing a schematic configuration of the semiconductor integrated circuit device according to the second embodiment of the invention.

FIG. 3 is a cross sectional view showing the configuration of a semiconductor integrated circuit device according to a second embodiment of the invention. FIG. 4 is a plan view showing a schematic configuration of the semiconductor integrated circuit device according to the second embodiment of the invention. FIG. 3 is a cross section taken along a line Y—Y of the plan view of FIG. 4. For easier understanding, FIG. 4 shows only main components.

A semiconductor integrated circuit device according to the second embodiment of the invention includes a metal electrodes 3b on one side, an insulation dielectric 4 formed on the metal electrode 3b on one side, the metal electrode 3a on the other side formed on the insulation dielectric 4, a first interlayer connection wiring 2a formed on the metal electrode 3a on the other side, a loop-shaped ground potential electrode wiring 8 formed in a loop shape around a semiconductor integrated circuit body 11 and a part of which is formed on the first interlayer connection wiring 2a, a second interlayer connection wiring 2b formed on the metal electrode 3b on one side, and a loop-shaped power source potential electrode wiring 9 formed in a loop shape around the semiconductor integrated circuit body 11 and a part of which is formed on the second interlayer connection wiring 2b.

In gaps among the metal electrodes, interlayer connection wirings, and loop-shaped electrode wirings (power source rings), an interlayer insulation film 10 is formed. The power source potential V is supplied to the loop-shaped power source potential electrode wiring 9, and the loop-shaped ground potential electrode wiring 8 is grounded.

By the metal electrode 3b on one side, the metal electrode 3a on the other side, and the insulation dielectric 4 sandwiched by the electrodes 3b and 3a, an MIM structure capacitor is constructed.

The configuration of the semiconductor integrated circuit device according to the second embodiment of the invention has, in short, the metal electrode 3b on one side connected to the loop-shaped power source potential electrode wiring 9 via at least one interlayer connection wiring, the metal electrode 3a on the other side connected to the loop-shaped ground potential electrode wiring 8 via at least one interlayer connection wiring, and the insulation dielectric 4 sandwiched by the metal electrode 3b on one side and the metal electrode 3a on the other side.

A method of manufacturing the semiconductor integrated circuit device according to the second embodiment of the invention will now be described. In the following, only the manufacturing method of the portion shown in FIG. 3 in the semiconductor integrated circuit device according to the second embodiment of the invention will be described.

The whole portion of the interlayer insulation film 10 shown in the figure is not generated at once but is formed by stacking layers step by step in correspondence with other stacked products.

First, by depositing a metal film on the interlayer insulation film 10 and patterning the metal film, the metal electrode 3b on one side is formed.

After forming the metal electrode 3b on one side, by depositing an insulation dielectric material on the metal electrode 3b on one side and patterning the insulation dielectric material, the insulation dielectric 4 is formed on a part of the metal electrode 3b on one side.

After forming the insulation dielectric 4, the interlayer insulation film 10 is deposited and the top face of the interlayer insulation film 10 is planarized so that the top face of the insulation dielectric 4 is exposed, thereby forming the interlayer insulation film 10 to the same level as the top face of the insulation dielectric 4.

After depositing and planarizing the interlayer insulation film 10, a metal film is deposited on the insulation dielectric 4 and the interlayer insulation film 10 and patterned, thereby forming the metal electrode 3a on the other side so as to cover at least the top face of the insulation dielectric 4.

After forming the metal electrode 3a on the other side, the interlayer insulation film 10 is deposited to a predetermined thickness, and the top face of the interlayer insulation film 10 is planarized.

After depositing and planarizing the interlayer insulation film 10, contact holes are opened in the interlayer insulation film 10 on the metal electrode 3b on one side and the metal electrode 3a on the other side, an interlayer connection wiring material is deposited so as to bury the contact holes and an unnecessary interlayer connection wiring material on the interlayer insulation film 10 is removed, thereby forming the first interlayer connection wiring 2a on the metal electrode 3a on the other side and the second interlayer connection wiring 2b on the metal electrode 3b on one side.

After forming the first interlayer connection wiring 2a and the second interlayer connection wiring 2b, by depositing a metal film on the first interlayer connection wiring 2a, second interlayer connection wiring 2b, and interlayer insulation film 10 and patterning the metal film, the loop-shaped ground potential electrode wiring 8 connected to the first interlayer connection wiring 2a and the loop-shaped power source potential electrode wiring 9 connected to the second interlayer connection wiring 2b are formed.

After forming the loop-shaped ground potential electrode wiring 8 and the loop-shaped power source potential electrode wiring 9, the interlayer insulation film 10 is deposited and the top face of the interlayer insulation film 10 is planarized so that the top faces of the loop-shaped ground potential electrode wiring 8 and the loop-shaped power source potential electrode wiring 9 are exposed, thereby forming the interlayer insulation film 10 to the same level with the top faces of the loop-shaped ground potential electrode wiring 8 and the loop-shaped power source potential electrode wiring 9. In such a manner, the, manufacturing of the semiconductor integrated circuit device according to the second embodiment of the invention shown in FIGS. 3 and 4 is completed.

In the semiconductor integrated circuit device according to the second embodiment of the invention and the method of manufacturing the same, with the above described configuration, the MIM structure capacitor is connected as a by-pass capacitor between the loop-shaped power source potential electrode wiring and the loop-shaped ground potential electrode wiring which are adjacent to each other, that is, between the power source rings of the power source potential and the ground potential each via at least one interlayer connection wiring. Consequently, while effectively suppressing the possibility of destruction and increase in the number of manufacturing steps and cost, power source noise can be eliminated or suppressed by the by-pass capacitor having a sufficient capacitance. Therefore, power source noise entering from the external and power source noise occurring in the LSI can be blocked at the power source input/output nodes. Further, by removing the by-pass capacitor from the top face of the mounting board, the mounting area and the volume can be reduced.

As described above, in the semiconductor integrated circuit device according to each of the foregoing embodiments of the invention and the method of manufacturing the same, the metal electrode on one side connected to the power source potential electrode wiring or the ground potential electrode wiring via at least one interlayer connection wiring, the metal electrode on the other side connected to the ground potential electrode wiring or power source potential electrode wiring via at least one interlayer connection wiring, and the insulation dielectric sandwiched between the metal electrode on one side and the metal electrode on the other side are formed. That is, the MIM structure capacitor connected between the power source potential electrode wiring and the ground potential electrode wiring each via at least one interlayer connection wiring is formed. Thus, effects as described above can be obtained.

Although the metal electrode on one side or the metal electrode on the other side is connected to the power source potential electrode wiring or ground potential electrode wiring via at least one interlayer connection wiring, such connections may be formed via two or more interlayer connection wirings and at least one metal wiring layer.

What is claimed is:

1. A semiconductor integrated circuit device comprising an MIM structure capacitor connected between a power source potential electrode wiring and a ground potential electrode wiring each via at least one interlayer connection wiring, wherein said power source potential electrode wiring comprises a loop-shaped power source potential electrode wiring which is formed in a loop shape around a semiconductor integrated circuit body and to which a power source potential is supplied, and said ground potential electrode wiring comprises a loop-shaped ground potential electrode wiring which is formed in a loop shape around the semiconductor integrated circuit body and is grounded.

2. The semiconductor integrated circuit device according to claim 1, wherein a metal electrode on one side of said MIM structure capacitor is connected to said power source potential electrode wiring via two or more interlayer connection wirings and at least one metal wiring layer.

3. The semiconductor integrated circuit device according to claim 2, wherein a metal electrode on the other side of said MIM structure capacitor is connected to said ground potential electrode wiring via two or more interlayer connection wirings and at least one metal wiring layer.

4. The semiconductor integrated circuit device according to claim 1, wherein said power source potential electrode wiring and said ground potential electrode wiring are adjacent to each other via an insulation film.

5. A semiconductor integrated circuit device comprising:
a metal electrode on one side of an MIM structure capacitor connected to a power source potential electrode wiring via at least one interlayer connection wiring;
a metal electrode on the other side of the MIM structure capacitor connected to a ground potential electrode wiring via at least one interlayer connection wiring; and
an insulation dielectric sandwiched by said metal electrode on one side of the MIM structure capacitor and said metal electrode on the other side of the MIM structure capacitor,
wherein said power source potential electrode wiring comprises a loop-shaped power source potential electrode wiring which is formed in a loop shape around a semiconductor integrated circuit body and to which a power source potential is supplied, and said ground potential electrode wiring comprises a loop-shape ground potential electrode wiring which is formed in a loop shape around the semiconductor integrated circuit body and is grounded.

6. The semiconductor integrated circuit device according to claim 5, wherein said metal electrode on one side is connected to said power source potential electrode wiring via two or more interlayer connection wirings and at least one metal wiring layer.

7. The semiconductor integrated circuit device according to claim 5, wherein said metal electrode on the other side is connected to said ground potential electrode wiring via two or more interlayer connection wirings and at least one metal wiring layer.

8. The semiconductor integrated circuit device according to claim 5, wherein said power source potential electrode wiring and said ground potential electrode wiring are adjacent to each other via an insulation film.

* * * * *